United States Patent
Zhou et al.

(10) Patent No.: US 9,871,538 B2
(45) Date of Patent: Jan. 16, 2018

(54) METHOD AND APPARATUS FOR ADJUSTING PEAK POWER CAPABILITY

(71) Applicant: Telefonaktiebolaget L M Ericsson (publ), Stockholm (SE)

(72) Inventors: Liushuan Zhou, Beijing (CN); Tao Huang, Beijing (CN); Xiaohui Hu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/390,228

(22) PCT Filed: Jan. 16, 2014

(86) PCT No.: PCT/CN2014/070741
§ 371 (c)(1),
(2) Date: Oct. 2, 2014

(87) PCT Pub. No.: WO2015/106422
PCT Pub. Date: Jul. 23, 2015

(65) Prior Publication Data
US 2015/0200630 A1 Jul. 16, 2015

(51) Int. Cl.
*H04B 1/04* (2006.01)
*H03F 3/19* (2006.01)
(Continued)

(52) U.S. Cl.
CPC .............. *H04B 1/04* (2013.01); *H03F 1/0288* (2013.01); *H03F 3/19* (2013.01); *H03F 3/245* (2013.01);
(Continued)

(58) Field of Classification Search
CPC ..... H03F 1/02; H03F 3/21; H03F 3/19; H03F 1/0288; H03F 3/602; H03F 1/56;
(Continued)

(56) References Cited

U.S. PATENT DOCUMENTS

| | | | |
|---|---|---|---|
| 5,757,229 | A | 5/1998 | Mitzlaff |
| 7,619,468 | B1 | 11/2009 | Bowles et al. |

(Continued)

FOREIGN PATENT DOCUMENTS

| | | |
|---|---|---|
| CN | 101404638 | 4/2009 |
| CN | 103199798 | 7/2013 |
| JP | 2008131186 A * | 6/2008 |

OTHER PUBLICATIONS

PCT Notification of Transmittal of the International Search Report and the Written Opinion of the International Searching Authority, or the Declaration for International Application No. PCT/CN2014/070741, dated Dec. 5, 2014.

(Continued)

*Primary Examiner* — Hirdepal Singh
(74) *Attorney, Agent, or Firm* — Baker Botts, LLP (57) ABSTRACT

One of the embodiments of the present disclosure relates to a method for adjusting peak power capability of a power amplifier circuitry. The power amplifier circuitry comprises at least one main amplifier path and at least one peak amplifier path and is configured to output a signal combining amplified signals from the at least one main amplifier path and the at least one peak amplifier path. The method comprises calculating a PAPR of an input signal of the power amplifier circuitry; determining at least one configuration parameter of the at least one peak amplifier path depending upon the calculated PAPR of the input signal; and configuring the at least one peak amplifier path based on the determined at least one configuration parameter, thereby adjusting the peak power capability of the power amplifier circuitry. The present disclosure also relates to corresponding apparatus and wireless communication devices.

19 Claims, 6 Drawing Sheets

(51) Int. Cl.
*H04W 52/52* (2009.01)
*H03F 1/02* (2006.01)
*H03F 3/24* (2006.01)
*H04B 17/13* (2015.01)

(52) U.S. Cl.
CPC ....... *H04W 52/52* (2013.01); *H03F 2200/451* (2013.01); *H03F 2203/21106* (2013.01); *H04B 17/13* (2015.01); *H04B 2001/045* (2013.01); *H04B 2001/0416* (2013.01)

(58) Field of Classification Search
CPC ......... H03F 2200/387; H03F 2200/423; H03F 1/0294; H03F 2200/378; H03F 2200/451; H03F 3/191; H03F 3/211; H03F 3/24; H03F 3/68; H03F 2203/21106; H03F 3/245; H04B 17/13; H04B 1/04; H04B 2001/0416; H04B 2001/045; H04W 52/52
See application file for complete search history.

(56) References Cited

U.S. PATENT DOCUMENTS

| | | | |
|---|---|---|---|
| 2008/0068078 A1 | 3/2008 | Iwasaki | |
| 2010/0029225 A1* | 2/2010 | Urushihara et al. | 455/110 |
| 2011/0169590 A1* | 7/2011 | Namerikawa | H01P 5/12 333/136 |
| 2011/0199156 A1* | 8/2011 | Hayakawa | H03F 1/0288 330/124 R |
| 2012/0176194 A1* | 7/2012 | Kim | H03F 3/602 330/124 R |
| 2012/0250749 A1* | 10/2012 | Tadano | H03F 1/02 375/224 |
| 2013/0076435 A1* | 3/2013 | Cabrera | H03F 1/0288 330/53 |
| 2013/0141166 A1* | 6/2013 | He et al. | 330/295 |
| 2014/0085000 A1 | 3/2014 | Dalisda et al. | |
| 2014/0125409 A1* | 5/2014 | Ahmed | H03F 1/0222 330/129 |
| 2015/0022270 A1* | 1/2015 | Outaleb | 330/295 |
| 2015/0091653 A1* | 4/2015 | Kobayashi et al. | 330/295 |

OTHER PUBLICATIONS

PCT Notification Concerning Transmittal of International on Patentability (Chapter 1 of the Patent Cooperation Treaty (PCT Rule 44bis.1(c)) re PCT/CN2014/070741, dated Jul. 28, 2016.
Communication with Written Opinion and Supplementary European Search Report regarding Appln. 14878804.5-1805/3095190 PCT/CN2014070741, dated Aug. 22, 2017.

* cited by examiner

METHOD AND APPARATUS FOR ADJUSTING PEAK POWER CAPABILITY

PRIORITY

This nonprovisional application is a U.S. National Stage Filing under 35 U.S.C. §371 of International Patent Application Serial No. PCT/CN2014/070741, filed Jan. 16, 2014, and entitled "Method and Apparatus for Adjusting Peak Power Capability."

TECHNICAL FIELD

The present disclosure relates to wireless communication, and more particularly to methods and apparatus for adjusting peak power capability of a power amplifier circuitry.

DESCRIPTION OF THE RELATED ART

In a modern wireless communication system, transmitters such as those operated in various base stations or user terminals work with huge of configurations based on the factors of carrier number, carrier spacing, radio access technology types, information bandwidth, etc. Due to such different configurations, a signal to be transmitted over the transmitter in the radio-based communication system will have a peak to average power radio (PAPR) that may vary in a very large range.

In a conventional solution, the transmitter need to have a peak power capability to fulfill the maximum signal PAR requirement of the system, although it is possible that the signal PAPR stays at a lower level for a relatively long term. The peak power capability depends partially on saturation points of the power amplifier circuitry in the transmitter. In practice, the characteristics of power amplifier circuitry are usually subject to "drifting" due to many factors such as batch variations, ambient conditions, aging, etc. The peak power capability of the power amplifier circuitry needs to be calibrated individually based on the maximum peak power value and a margin for "drifting" and then the calibration results may be saved in a storage device, which may be incorporated in the transmitter. In this way, a fix target PAPR is applied to calibrate the power amplifier circuitry in the phase of production and the power consumption of the transmitter is also fixed when the production finished. When working on site, the power amplifier circuitry of the transmitter always operates at its maximum peak power capability and has highest power consumption resulted therefrom.

Therefore, there is a need to reduce power consumption of power amplifier circuitries in such transmitters that are used to transmit signals with a relatively large PAPR variance in a wireless communication system.

SUMMARY OF THE INVENTION

To solve at least one of the problems in the prior art, one or more method and apparatus embodiments according to the present disclosure aim to provide a solution for adjusting peak power capability of a power amplifier circuitry.

According to an aspect of the present disclosure, an embodiment of the present disclosure provides a method for adjusting peak power capability of a power amplifier circuitry. The power amplifier circuitry comprises at least one main amplifier path and at least one peak amplifier path and the power amplifier circuitry is configured to output a signal combining amplified signals from the at least one main amplifier path and the at least one peak amplifier path. The method comprises: calculating a Peak to Average Power Ratio, PAPR, of an input signal of the power amplifier circuitry; determining at least one configuration parameter of the at least one peak amplifier path depending upon the calculated PAPR of the input signal; and configuring the at least one peak amplifier path based on the determined at least one configuration parameter, thereby adjusting the peak power capability of the power amplifier circuitry. According to one or more embodiments of the present embodiments, the calculated PAPR of the input signal is used to identify an entry in a lookup table that stores the at least one configuration parameter in association with a target PAPR.

According to an aspect of the present disclosure, an embodiment of the present disclosure provides an apparatus for an apparatus for adjusting peak power capability of a power amplifier circuitry. The power amplifier circuitry comprises at least one main amplifier path and at least one peak amplifier path and the power amplifier circuitry is configured to output a signal combining amplified signals from the at least one main amplifier path and the at least one peak amplifier path. The apparatus comprises: a calculating unit configured to calculate a Peak to Average Power Ratio, PAPR, of an input signal of the power amplifier circuitry; a determining unit configured to determine at least one configuration parameter of the at least one peak amplifier path depending upon the calculated PAPR of the input signal; and a controlling unit configured to configuring the at least one peak amplifier path based on the determined at least one configuration parameter, thereby adjusting the peak power capability of the power amplifier circuitry. According to one or more embodiments of the present embodiments, the determining unit is configured to use the calculated PAPR of the input signal to identify an entry in a lookup table that stores the at least one configuration parameter in association with a target PAPR.

According to an aspect of the present disclosure, an embodiment of the present disclosure provides a wireless communication device. The wireless communication device comprises a power amplifier circuitry comprising at least one main amplifier path and at least one peak amplifier path, wherein the power amplifier circuitry is configured to output a signal combining amplified signals from the at least one main amplifier path and the at least one peak amplifier path. The wireless communication device further comprise: a calculating circuit configured to calculate a Peak to Average Power Ratio, PAPR, of an input signal of the power amplifier circuitry; a determining circuit configured to determine at least one configuration parameter of the at least one peak amplifier path depending upon the calculated PAPR of the input signal; and a controlling circuit configured to configure the at least one peak amplifier path based on the determined at least one configuration parameter, thereby adjusting the peak power capability of the power amplifier circuitry. According to one or more embodiments of the present invention, the wireless communication device is a wireless network node or a wireless terminal device.

According to an aspect of the present disclosure, an embodiment of the present disclosure provides a wireless communication device. The wireless communication device comprises one or more processors; and one or more memories including computer program code. The one or more memories and the computer program code configured to, with the one or more processors, cause the wireless communication device to: calculate a Peak to Average power Ratio, PAPR, of an input signal of the power amplifier circuitry, wherein the power amplifier circuitry comprises at least one amplifier path and at least one peak amplifier path and the power amplifier circuitry is configured to output a signal combining amplified signals from the at least one main amplifier path and the at least one peak amplifier path; determine at least one configuration parameter of the at least one peak amplifier path depending upon the calculated PAPR of the input signal; and configure the at least one peak amplifier path based on the determined at least one configuration parameter, thereby adjusting the peak power capability of the power amplifier circuitry.

According to an aspect of the present disclosure, an embodiment of the present disclosure provides a wireless communication device. The wireless communication device comprises processing means adapted to: calculate a Peak to Average Power Ratio, PAPR, of an input signal of the power amplifier circuitry, wherein the power amplifier circuitry comprises at least one main amplifier path and at least one peak amplifier path and the power amplifier circuitry is configured to output a signal combining amplified signals from the at least one main amplifier path and the at least one peak amplifier path; determine at least one configuration parameter of the at least one peak amplifier path depending upon the calculated PAPR of the input signal; and configure the at least one peak amplifier path based on the determined at least one configuration parameter, thereby adjusting the peak power capability of the power amplifier circuitry.

According to one or more embodiments of the present disclosure, the peak power capability of the power amplifier circuitry can be adjusted by tracking the input signal PAPR. As a result, the operating status of the power amplifier circuitry in the transmitter is capable of varying adaptively in response to the change of the input signal's PAPR. In this way, the power consumption of the transmitter can be reduced and transmission efficiency can be improved when the transmitter is operating on site, especially in taking a relatively long-term perspective.

BRIEF DESCRIPTION OF THE DRAWINGS

Inventive features regarded as the characteristics of the present invention are set forth in the appended claims. However, the present invention, its implementation mode, other objectives, features and advantages will be better understood through reading the following detailed description on the exemplary embodiments with reference to the accompanying drawings, where in the drawings:

DETAILED DESCRIPTION OF THE PREFERRED EMBODIMENT

Hereinafter, embodiments of the present disclosure will be described with reference to the accompanying drawings.

In the following description, many specific details are illustrated so as to understand the present disclosure more comprehensively. However, it is apparent to the skilled in the art that implementation of the present disclosure may not have these details. Additionally, it should be understood that the present invention is not limited to the particular embodiments as introduced here. On the contrary, any arbitrary combination of the following features and elements may be considered to implement and practice the present invention, regardless of whether they involve different embodiments. Thus, the following aspects, features, embodiments and advantages are only for illustrative purposes, and should not be understood as elements or limitations of the appended claims, unless otherwise explicitly specified in the claims.

Figure 1:
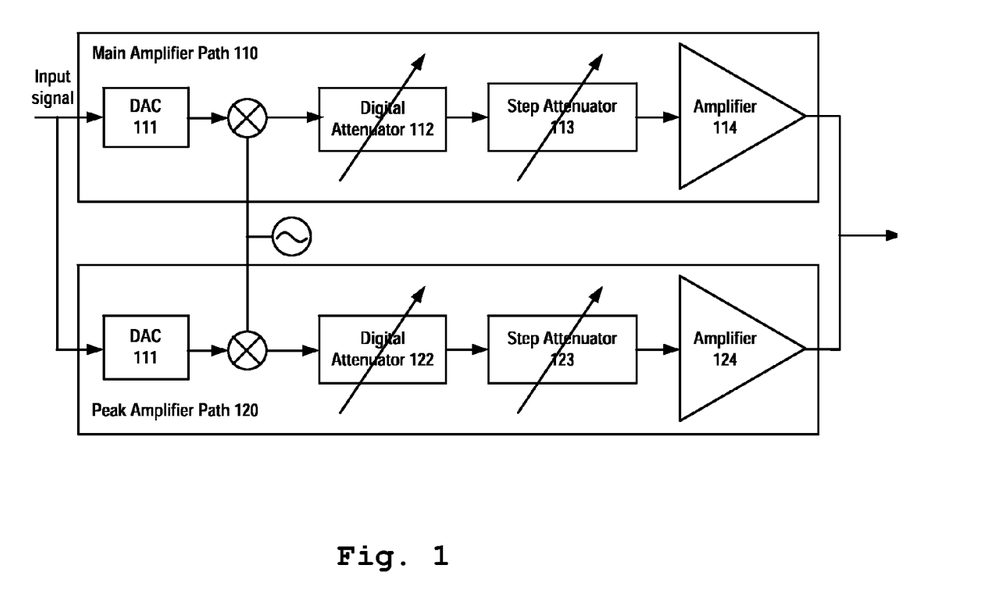
FIG. 1 illustrates a schematic diagram of an exemplary power amplifier circuitry for which one or more embodiments of the present disclosure can be implemented.

FIG. 1 illustrates a schematic diagram of an exemplary power amplifier circuitry for which one or more embodiments of the present disclosure can be implemented.

FIG. 1 schematically illustrates a digital Doherty structure of a power amplifier circuitry 100, which can be used in a wireless communication device such as a wireless network node or a wireless user terminal. As illustrated in FIG. 1, the power amplifier circuitry 100 includes two amplifier paths, a main amplifier path 110 and a peak amplifier path 120. An input signal is divided into two parts by a power distributor (not shown in FIG. 1), which are then fed into the main amplifier path 110 and the peak amplifier path 120, respectively. The power amplifier circuitry 100 is configured to output a signal combining amplified signals from the main amplifier path 110 and the peak amplifier path 120.

Specifically, the power amplifier circuitry 100 has substantially symmetrical structure in the two amplifier paths. As shown in FIG. 1, the main amplifier path 110 may include a digital-to-analog converter (DAC) 111, a digital attenuator 112, which may have for example 0.05 dB precision, a step attenuator 113, which may have for example 1 dB precision, a main amplifier 114; correspondingly, the peak amplifier path 120 may also include a DAC 121, a digital attenuator 122, which may have for example 0.05 dB precision, a step attenuator 123, which may have for example 1 dB precision, a peak amplifier 124. The power amplifier circuitry 100 may also include a transmit signal observation path (not shown), by which the power of the output signal of the power amplifier circuitry 100 is measured and compared with the input signal so that the digital pre-distortion algorithm can be used to improve the RF linearity and efficiency of the power amplifier circuitry 100.

Generally speaking, the function of the digital pre-distortion algorithm in the power amplifier circuitry 100 is to linearize and correct for weak unlinearities in the amplifier characteristics, but it cannot be used to compensate beyond the amplifier saturation point. So the power amplifier circuitry 100 should be calibrated in production to assure that it has sufficient capability of delivering the peak output power. In the conventional solution, it is required a fix target to calibrate the peak power of the power amplifier circuitry 100 based on the nominal output power and maximum PAPR. However, as the foregoing discussion, when the transmitter works on site, due to different configurations of radio standards, the input signal PAPR may vary in a very large range. If the power amplifier circuitry still works in the fixed calibration status, the transmitter will always operate at its highest power consumption, which unnecessarily consumes excess energy. Various embodiments of the present disclosure are designed to address at least that problem in such power amplifier circuitries, as exemplarily shown in FIG. 1.

Some variants or modifications of the structure of the power amplifier 100 may also be used to implement embodiments of the present disclosure. In one alternative implementation, for example, the DAC 111 in the main amplifier path 110 and the DAC 121 in the peak amplifier path 120 may be combined as a single digital-to-analog converter, which converts the input signal and then inputs the converted signal into the power distributor so as to be distributed to the main and peak amplifier paths respectively. According to another implementation, it is possible to omit the digital attenuators 112 and 122 in the power amplifier circuitry.

Although with reference to FIG. 1, a two-path digital symmetrical Doherty structure of the power amplifier circuitry 100 is described as an example of power amplifier circuitry in which one or more embodiments of the present disclosure can be implemented, those skilled can appreciate that various embodiments of the present disclosure can also be implemented in any other suitable types of power amplifier circuitries that include at least one main amplifier path and at least one peak amplifier. As further examples, in Chinese Patent Application Publication CN103178768A entitled "Multi-path Doherty Circuit", there is disclosed some other suitable types of power amplifier circuitry structures, which includes multiple main amplifier paths and/or multiple peak amplifier paths, as illustrated in its FIGS. 2-9, 12-19.

Nevertheless, those skilled in the art should note that it would not lose generality to describe various embodiments of the present disclosure based on the example two-path power amplifier circuitry illustrated by FIG. 1, due to equivalence characteristics of those circuitries. Multiple main/peak amplifier paths of a power amplifier circuitry can be equivalent to one single main/peak path in electrical characteristics thereof. Therefore, it can be understood that the implementation of embodiments of the present disclosure are not limited to any specific circuit structure of the main and peak amplifier path (s) of the power amplifier circuitry, but rather able to benefit various power amplifier circuitries with different main and peak path structures.

Figure 2:
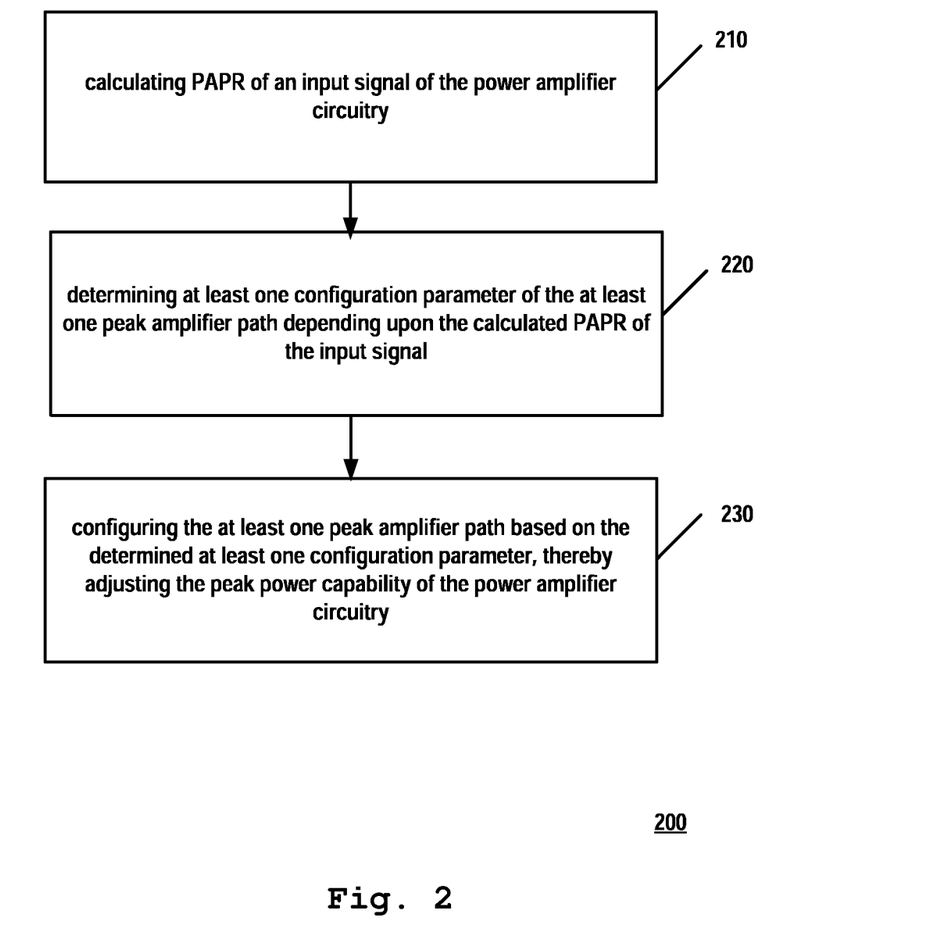
FIG. 2 schematically illustrates an exemplary flow chart of a method for adjusting peak power capability according to one or more embodiments of the present disclosure.
Figure 5:
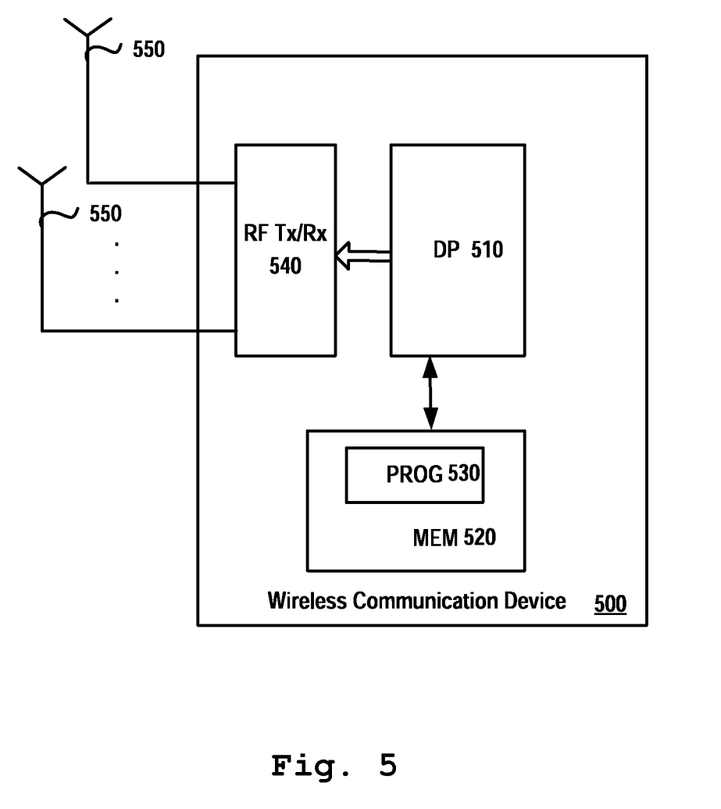
FIG. 5 schematically illustrates another block diagram of a wireless communication device according to one or more embodiments of the present disclosure.

With reference to FIGS. 2 and 5, various embodiments of the present disclosure will be set forth in detail.

FIG. 2 schematically illustrates an exemplary flow chart of a method (200) for adjusting peak power capability according to one or more embodiments of the present disclosure.

As illustrated in FIG. 2, in block 210, a PAPR of an input signal of a power amplifier circuitry is calculated. The power amplifier circuitry, for example as shown in FIG. 1, comprises at least one main amplifier path (110) and at least one peak amplifier path (120). And the power amplifier circuitry (100) is configured to output a signal combining amplified signals from the at least one main amplifier path (110) and the at least one peak amplifier path (120).

In block 220, at least one configuration parameter of the at least one peak amplifier path is determined depending upon the calculated PAPR of the input signal.

According to one or more embodiments of the present disclosure, the calculated PAPR of the input signal is used to identify an entry in a lookup table that stores the at least one configuration parameter in association with a target PAPR.

The lookup table may be built by calibrating at least the at least one peak amplifier path (120) in a production stage of the power amplifier circuitry (100). In calibration process, series designed target PAPR values are used to calibrate the peak power capability of the power amplifier circuitry (100). According to an exemplary implementation, the power consumption of the power amplifier at every target value is optimized by performing a multi-dimensional optimization, for example, sweeping a plurality of configuration parameters of the at least one peak amplifier path.

According to an embodiment, the at least one configuration parameter of the at least one peak amplifier path (120) comprises a supply voltage Vdd of the amplifier (124) in the at least one peak amplifier path (120). The Vdd of the peak amplifier shall be minimized in the optimization so as to maximize DC-efficiency.

Additionally, the at least one configuration parameter of the at least one peak amplifier path (120) may further comprise one or more parameters selected from a group of:

an attenuation value applied to the at least one peak amplifier path (120);

a gain magnitude difference between the at least main amplifier path (110) and the at least one peak amplifier path (120);

a phase offset between the at least main amplifier path (110) and the at least one peak amplifier path (120).

It should be noted that the main amplifier path(s) may be required to be calibrated together with the peak amplifier path(s) of the power amplifier circuitry, if the designed configuration parameters to be calibrated include the gain magnitude difference and/or phase offset between the main amplifier path(s) and the peak amplifier path(s).

Any of the configuration parameters of the at least one peak amplifier path as discussed foregoing may be considered as an equivalent configuration parameter, in the case that multiple peak amplifier paths are adopted in the power amplifier circuitry. Those skilled in the art may choose to adjust a configuration parameter value(s) of one or more real circuitry components in the multiple peak amplifier paths so as to achieve the equivalent effect of configuring the corresponding equivalent configuration parameter.

When finishing the calibration process based on all the target values, the calibration results can be saved as a lookup table in a memory, for example, a flash memory of the transmitter. The lookup table records the correspondence between plural target PAPR values and the at least configuration parameters of the at least one peak amplifier path. In an advantageous example, the target PAPR values may be configured to reflect different peak power levels of transmit signals for different Radio Access Technologies (RATs) such as, GSM, WCDMA, LTE, etc. While the transmitter operates on site, the lookup table can be loaded for subsequent processing.

In block 230, the at least one peak amplifier path (120) is configured based on the determined at least one configuration parameter, thereby adjusting the peak power capability of the power amplifier circuitry (100).

Additionally, in block 230, the at least one main amplifier path (110) may also be configured to achieve, for example, the determined gain magnitude difference between the at least main amplifier path (110) and the at least one peak amplifier path (120) and/or a phase offset between the at least main amplifier path (110) and the at least one peak amplifier path (120). To adjust the peak power capability of the power amplifier circuitry (110), the supply voltage of the main amplifier (114) may also be considered as an option of those configuration parameters of the power amplifier circuitry (100).

Figure 3:
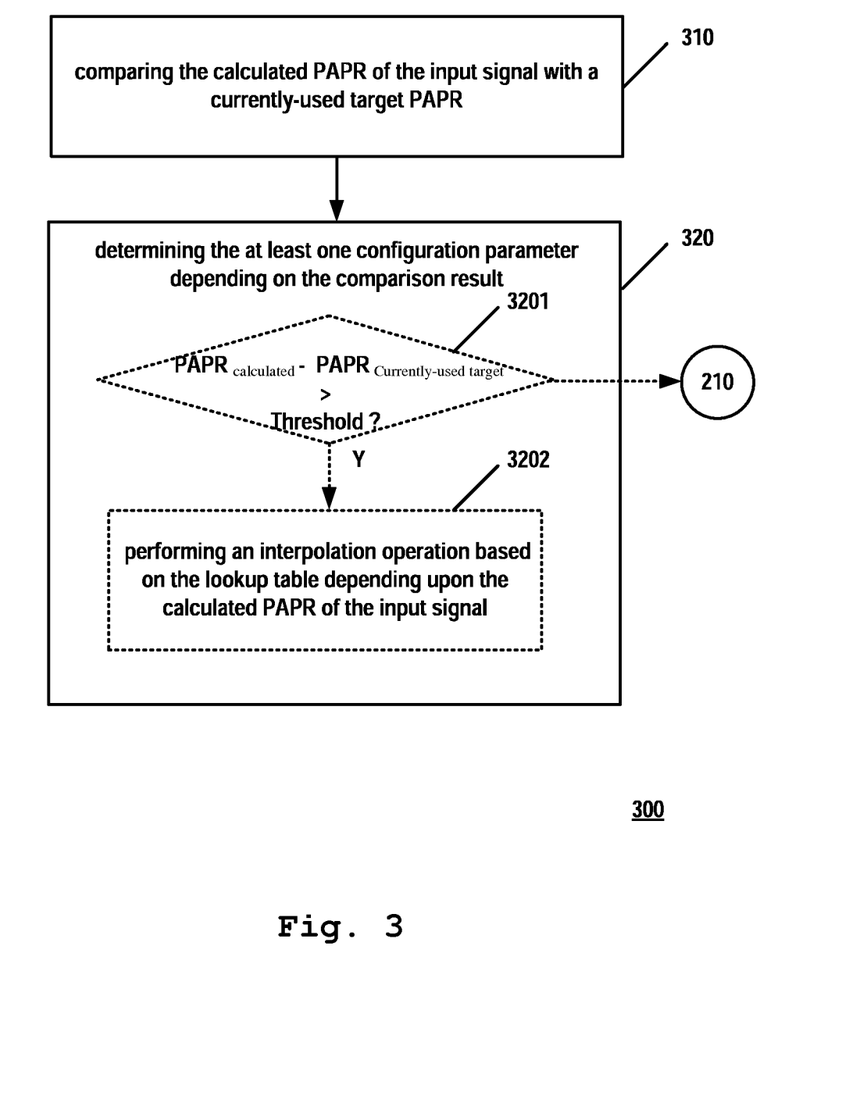
FIG. 3 schematically illustrates an exemplary process of determining configuration parameters of the peak amplifier path(s) according to one or more embodiments of the present disclosure.

FIG. 3 schematically illustrates an exemplary process (300) of determining (220) configuration parameters of the peak amplifier path(s) according to one or more embodiments of the present disclosure.

As illustrated in FIG. 3, in block 310, the calculated PAPR of the input signal is compared with a currently-used target PAPR.

In block 320, the at least one configuration parameter may be determined depending on the comparison result between the calculated PAPR of the input signal and the currently-used target PAPR.

According to an advantageous embodiment of the present disclosure, it may be determined in block 3201 whether the difference between the calculated PAPR of said input signal and the currently-used target PAPR is greater than a threshold or not.

If the determination result in block 3201 is positive, that is, the difference between the calculated PAPR of said input signal and the currently-used target PAPR is greater than the threshold, then in block 3202, an interpolation operation may be performed based on the lookup table depending upon the calculated PAPR of the input signal so as to determine the updated configuration parameter(s).

If the determination result in block 3201 is negative, that is, the difference between the calculated PAPR of the input signal and the currently-used target PAPR is equal or less than the threshold, the currently-used target PAPR remains unchanged and the process will proceed with block 210 to keep tracking PAPR of the input signal.

Apparently, the processing of blocks 3201-3202 provides only one example of how to determine (320) the at least one configuration parameter based on the comparison result between the calculated PAPR of the input signal and the currently-used target PAPR. However, various embodiments of the present disclosure are not limited to this example. Such determination may be made in any suitable way that optimized configuration parameters of the peak amplifier path(s) can be identified from the lookup table of the calibration results. For example, in an embodiment, within a predefined period of re-configuration, in order to configure the peak amplifier path(s) of the power amplifier circuitry, the configuration parameters may be simply determined by choosing from the lookup table a target PAPR value closest to the calculated PARP value of the input signal of the power amplifier circuitry.

It should be noted that the above depiction is only exemplary, not intended for limiting the present invention. In other embodiments of the present invention, this method may have more, or less, or different steps, and numbering the steps is only for making the depiction more concise and much clearer, but not for stringently limiting the sequence between each steps; while the sequence of steps may be different from the depiction. For example, in some embodiments, the above one or more optional steps may be omitted. Specific embodiment of each step may be different from the depiction. All these variations fall within the spirit and scope of the present invention.

According to one or more embodiments of the present disclosure, the peak power capability of the power amplifier circuitry can be adjusted by tracking the input signal PAPR. As a result, the operating status of the power amplifier circuitry in the transmitter is capable of varying adaptively in response to the change of the input signal PAPR. In this way, the power consumption of the transmitter can be reduced and transmission efficiency can be improved when the transmitter is operating on site, especially in taking a relatively long-term perspective.

Figure 4:
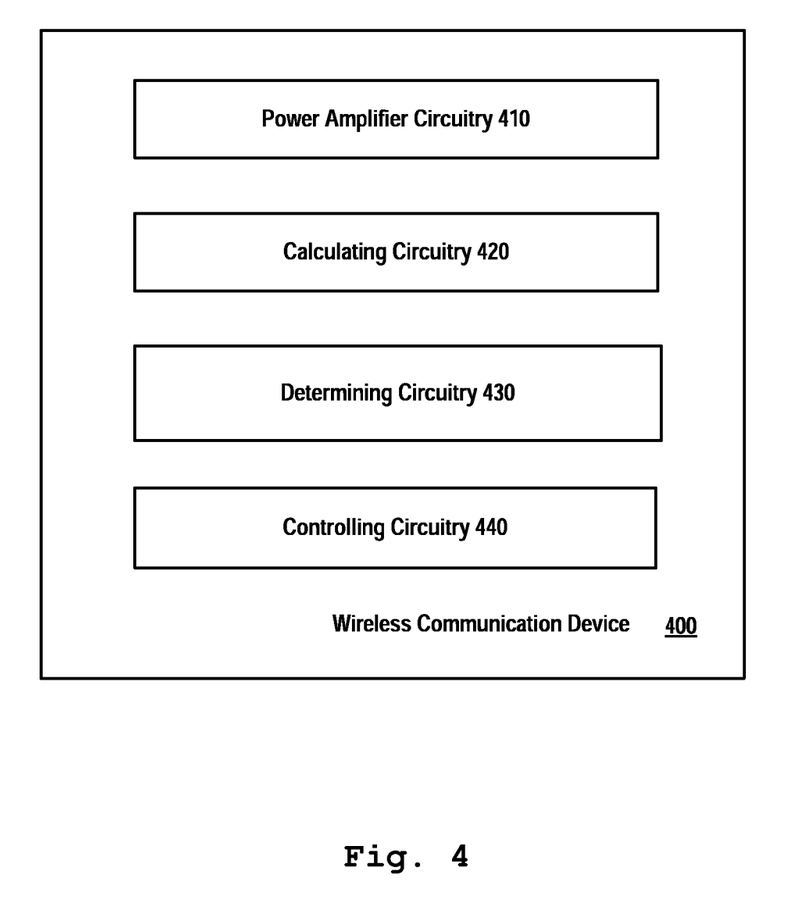
FIG. 4 schematically illustrates a block diagram of a wireless communication device according to one or more embodiments of the present disclosure.

FIG. 4 schematically illustrates a block diagram of a wireless communication device (400) according to one or more embodiments of the present disclosure.

As illustrated in FIG. 4, the wireless communication device 400 can be a wireless network node or a wireless terminal device, which comprises a power amplifier circuitry 410 having at least one main amplifier path and at least one peak amplifier path. The power amplifier circuitry 410 is configured to output a signal combining amplified signals from the at least one main amplifier path and the at least one peak amplifier path. The wireless communication device 400 further comprises a calculating circuitry 420, a determining circuitry 430 and a controlling circuitry 440. The calculating circuitry 420 is configured to calculate PAPR of an input signal of the power amplifier circuitry 410. The determining circuitry 430 is configured to determine at least one configuration parameter of the at least one peak amplifier path of the power amplifier circuitry 410 depending upon the PAPR calculated by the calculating circuitry 420. The controlling circuitry 440 is configured to configure the at least one peak amplifier path of the power amplifier circuitry 410 with the at least one configuration parameter determined by the determining circuitry 430, thereby adjusting the peak power capability of the power amplifier circuitry 410.

According to one or more embodiments of the present disclosure, the determining circuitry 430 may be configured to use the input signal PAPR calculated by the calculating circuitry 420 to identify an entry in a lookup table that stores the at least one configuration parameter in association with a target PAPR. The lookup table may be built by calibrating at least the at least one peak amplifier path in a production stage of the power amplifier circuitry 410.

According to one or more embodiments of the present disclosure, the determining circuitry 430 may be configured to compare the calculated PAPR of the input signal with a currently-used target PAPR and determine the at least one configuration parameter depending on the comparison result between the calculated PAPR of the signal and the currently-used target PAPR. In an implementation, the determining circuitry 430 may be configured to perform an interpolation operation based on the lookup table depending upon the input signal PAPR calculated by the calculating circuitry 420, if the difference between the calculated input signal PAPR and the currently-used target PAPR is greater than a threshold.

According to one or more embodiments of the present disclosure, the at least one configuration parameter of the at least one peak amplifier path of the power amplifier circuitry 410 may comprise a supply voltage of an amplifier (124) in the at least one peak amplifier path. Additionally, the at least one configuration parameter of the at least one peak amplifier path may further comprise one or more parameters selected from a group of an attenuation value applied to said at least one peak amplifier path; a gain magnitude difference between the at least main amplifier path and the at least one peak amplifier path; a phase offset between the at least main amplifier path and said at least one peak amplifier path.

FIG. 5 schematically shows a simplified block diagram of a wireless communication device according to an embodiment of the present invention.

In general, the various embodiments of the wireless communication device 400 and 500 can include, but are not limited to, wireless network nodes adapted for radio transmission in the wireless communication system, such as a base station, a NodeB, an evolved NodeB, a radio access point, relay node, or any other suitable wireless network node; and wireless terminal devices in the wireless communication system, such as cellular phones, PDAs having wireless communication capabilities, portable computers having wireless communication capabilities, image capture devices such as digital cameras having wireless communication capabilities, gaming devices having wireless communication capabilities, as well as portable units or terminals that incorporate combinations of such functions. Yet further, the wireless terminal device includes MTC (Machine Type Communication) devices, which do not necessarily involve human interaction.

The wireless communication device 500 is adapted for radio transmission in the wireless communication system via its antenna array 550.

The wireless communication device 500 includes a data processor (DP) 510, a memory (MEM) 520 coupled to/embedded in the DP 510, and suitable RF transmitter TX/receiver RX module 540 coupling the antenna array 550 to the DP 510. The RF TX/RX module 540 is for bidirectional wireless communications with at least one base station. The MEM 520 stores a program (PROG) 530.

The RF TX/RX module 540 contains a power amplifier circuitry (not shown in FIG. 5) for amplifying the transmit signal. The power amplifier circuitry said power amplifier circuitry comprises at least one main amplifier path and at least one peak amplifier path and the power amplifier circuitry is configured to output a signal combining amplified signals from the at least one main amplifier path and the at least one peak amplifier path. For example, the power amplifier circuitry may have a circuit structure or equivalent circuit structure as illustrated in FIG. 1.

The PROG 530 is assumed to include program instructions that, when executed by the DP 510, enable the wireless communication device 500 to operate in accordance with the exemplary embodiments of this disclosure, as discussed herein with the processing flows as shown in FIG. 2 and/or FIG. 3.

The MEM 520 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the wireless communication device 500, there may be several physically distinct memory units in the wireless communication device 500. According to one or more embodiments of the present disclosure, the MEM 520 is suitable to store a look up table (not shown in FIG. 5), in which at least one configuration parameter of at least one peak amplifier path of the power amplifier circuitry are stored in associated with a corresponding target PAPP. The lookup table is built by calibrating at least the at least one peak amplifier path in a production stage of the power amplifier circuitry.

The DP 510 performs any required processing as described with reference to FIGS. 2 and/or 3. The DP 510 may be of any type suitable to the local technical environment, and may include one or more of general purpose computers, special purpose computers, microprocessors, DSPs and processors based on multi-core processor architecture, as non-limiting examples.

Figure 6:
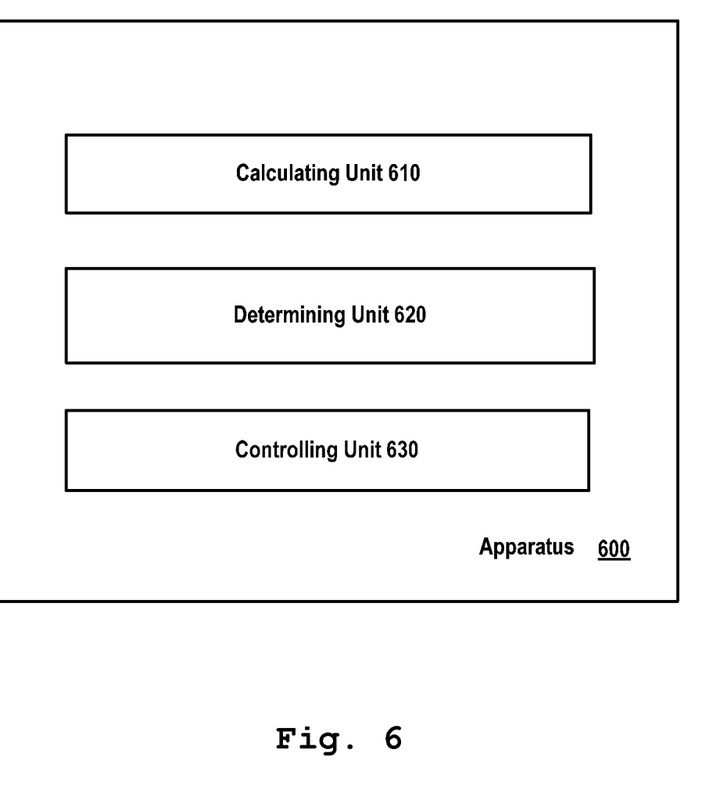
FIG. 6 schematically shows a simplified block diagram of an apparatus 600 according to an embodiment of the present invention.

FIG. 6 schematically shows a simplified block diagram of an apparatus 600 according to an embodiment of the present invention.

As illustrated in FIG. 6, the apparatus 600 for adjusting peak power capability of a power amplifier circuitry (100) comprises a calculating unit 610, a determining unit 620 and a controlling unit 630.

The calculating unit 610 is configured to calculate (210) a PAPR of an input signal of the power amplifier circuitry (100). The power amplifier circuitry (100), peak power capability of which is adjusted by the apparatus 600, comprises at least one main amplifier path (110) and at least one peak amplifier path (120) and the power amplifier circuitry (100) is configured to output a signal combining amplified signals from the at least one main amplifier path (110) and the at least one peak amplifier path (120).

The determining unit 620 is configured to determine (220) at least one configuration parameter of the at least one peak amplifier path (120) depending upon the calculated PAPR of the input signal. According to one or more embodiment of the present disclosure, the determining unit 620 may be configured to use the calculated PAPR of the input signal to identify an entry in a lookup table that stores the at least one configuration parameter in association with a target PAPR. The determining unit 620 may use the calculated PAPR of the input signal to identify an entry in a lookup table that stores the at least one configuration parameter in association with a target PAPR. According to one or more embodiments, the determining unit 620 may compare (310) the calculated PAPR of the input signal with a currently-used target PAPR and determine (320) the at least one configuration parameter depending on the comparison result between the calculated PAPR of the signal and the currently-used target PAPR. For example, if the difference between the calculated PAPR of the input signal and the currently-used target PAPR is determined (3201) to be greater than a threshold, then the determining unit may perform (3203) an interpolation operation based on the lookup table depending upon the calculated PAPR of the input signal.

The controlling unit 630 is configured to configure (230) the at least one peak amplifier path (120) based on the determined at least one configuration parameter, thereby adjusting the peak power capability of the power amplifier circuitry (100).

According to one or more embodiments of the present invention, the lookup table may be built by calibrating the at least one peak amplifier path (120) in a production stage of the power amplifier circuitry (100). The lookup table is used to store the correspondence between plural target PAPR and the at least configuration parameters of the at least one peak amplifier path (120). As an example, the at least one configuration parameter of the at least one peak amplifier path (120) may comprise a supply voltage of an amplifier (124) in the at least one peak amplifier path (120). As additional examples, the at least one configuration parameter of the at least one peak amplifier path (120) may further comprise one or more parameters selected from a group of: an attenuation value applied to the at least one peak amplifier path (120); a gain magnitude difference between the at least main amplifier path (110) and the at least one peak amplifier path (120); a phase offset between the at least main amplifier path (110) and the at least one peak amplifier path (120).

In general, the various exemplary embodiments may be implemented in hardware or special purpose circuits, software, logical or any combination thereof. For example, some aspects may be implemented in hardware, while other aspects may be implemented in firmware or software which may be executed by a controller, microprocessor or other processing means, although the invention is not limited thereto. While various aspects of the exemplary embodiments of this invention may be illustrated and described as block and controlling diagrams, it is well understood that these blocks, apparatus, systems, techniques or methods described herein may be implemented in, as non-limiting examples, hardware, software, firmware, special purpose circuits or logical, general purpose hardware or controller or other processing means, or some combination thereof.

As such, it should be appreciated that at least some aspects of the exemplary embodiments of the inventions may be practiced in various components such as integrated circuit chips and modules. As well known in the art, the design of integrated circuits is by and large a highly automated process.

The present invention may also be embodied in the computer program product which comprises all features capable of implementing the method as depicted herein and may implement the method when loaded to the computer system.

The present invention has been specifically illustrated and explained with reference to the preferred embodiments. The skilled in the art should understand various changes thereto in form and details may be made without departing from the scope of the present invention.

What is claimed is:

1. A method for adjusting peak power capability of a power amplifier circuitry, comprising:
    calculating a Peak to Average Power Ratio, PAPR, of an input signal of said power amplifier circuitry, wherein said power amplifier circuitry comprises at least one main amplifier path and at least one peak amplifier path and said power amplifier circuitry is configured to output a signal combining amplified signals from said at least one main amplifier path and said at least one peak amplifier path;
    determining at least one configuration parameter of said at least one peak amplifier path from a plurality of different configuration parameters depending upon the calculated PAPR of said input signal, the at least one configuration parameter operable to adjust the amplified signal from the at least one peak amplifier path; and
    configuring said at least one peak amplifier path based on the determined at least one configuration parameter, thereby adjusting said peak power capability of said power amplifier circuitry.

2. The method according to claim 1, wherein the step of determining at least one configuration parameter of said at least one peak amplifier path depending upon the calculated PAPR of said input signal comprising:
    using the calculated PAPR of said input signal to identify an entry in a lookup table that stores said at least one configuration parameter in association with a target PAPR.

3. The method according to claim 2, wherein the step of using the calculated PAPR of said input signal to identify an entry in a lookup table that stores said at least one configuration parameter in association with a target PAPR comprising:
    comparing the calculated PAPR of said input signal with a currently-used target PAPR;
    determining said at least one configuration parameter depending on the comparison result between the calculated PAPR of said signal and said currently-used target PAPR.

4. The method according to claim 3, wherein determining said at least one configuration parameter depending on the comparison result between the calculated PAPR of said signal and said currently-used target PAPR comprising:
    performing an interpolation operation based on said lookup table depending upon the calculated PAPR of said input signal, if the difference between the calculated PAPR of said input signal and the currently-used target PAPR is determined to be greater than a threshold.

5. The method according to claim 2, wherein
    said lookup table is built by calibrating at least said at least one peak amplifier path in a production stage of said power amplifier circuitry.

6. The method according to claim 1, wherein said at least one configuration parameter of said at least one peak amplifier path comprises: a supply voltage of an amplifier in said at least one peak amplifier path.

7. The method according to claim 6, wherein said at least one configuration parameter of said at least one peak amplifier path further comprises one or more parameters selected from a group of:
    an attenuation value applied to said at least one peak amplifier path;
    a gain magnitude difference between said at least main amplifier path and said at least one peak amplifier path;
    a phase offset between said at least main amplifier path and said at least one peak amplifier path.

8. An apparatus for adjusting peak power capability of a power amplifier circuitry, comprising:
    a calculating unit configured to calculate a Peak to Average Power Ratio, PAPR, of an input signal of said power amplifier circuitry, wherein said power amplifier circuitry comprises at least one main amplifier path and at least one peak amplifier path and said power amplifier circuitry is configured to output a signal combining amplified signals from said at least one main amplifier path and said at least one peak amplifier path;
    a determining unit configured to determine at least one configuration parameter of said at least one peak amplifier path from a plurality of different configuration parameters depending upon the calculated PAPR of said input signal, the at least one configuration parameter operable to adjust the amplified signal from the at least one peak amplifier path; and
    a controlling unit configured to configure said at least one peak amplifier path based on the determined at least one configuration parameter, thereby adjusting said peak power capability of said power amplifier circuitry.

9. The apparatus according to claim 8, wherein the determining unit is configured to use the calculated PAPR of said input signal to identify an entry in a lookup table that stores said at least one configuration parameter in association with a target PAPR.

10. The apparatus according to claim 9, wherein the determining unit is configured to:
    compare the calculated PAPR of said input signal with a currently-used target PAPR;
    determine said at least one configuration parameter depending on the comparison result between the calculated PAPR of said signal and said currently-used target PAPR.

11. The apparatus according to claim 10, wherein the determining unit is configured to:
    perform an interpolation operation based on said lookup table depending upon the calculated PAPR of said input signal, if the difference between the calculated PAPR of said input signal and the currently-used target PAPR is determined to be greater than a threshold.

12. The apparatus according to claim 9, wherein
    said lookup table is built by calibrating at least said at least one peak amplifier path in a production stage of said power amplifier circuitry.

13. The apparatus according to claim 8, wherein said at least one configuration parameter of said at least one peak amplifier path comprises: a supply voltage of an amplifier in said at least one peak amplifier path.

14. The apparatus according to claim 13, wherein said at least one configuration parameter of said at least one peak amplifier path further comprises one or more parameters selected from a group of:
- an attenuation value applied to said at least one peak amplifier path;
- a gain magnitude difference between said at least main amplifier path and said at least one peak amplifier path;
- a phase offset between said at least main amplifier path and said at least one peak amplifier path.

15. A wireless communication device, comprising:
- a power amplifier circuitry comprising at least one main amplifier path and at least one peak amplifier path, wherein said power amplifier circuitry is configured to output a signal combining amplified signals from said at least one main amplifier path and said at least one peak amplifier path;
- a calculating circuitry configured to calculate a Peak to Average Power Ratio, PAPR, of an input signal of said power amplifier circuitry;
- a determining circuitry configured to determine at least one configuration parameter of said at least one peak amplifier path from a plurality of different configuration parameters depending upon the calculated PAPR of said input signal, the at least one configuration parameter operable to adjust the amplified signal from the at least one peak amplifier path; and
- a controlling circuitry configured to configure said at least one peak amplifier path based on the determined at least one configuration parameter, thereby adjusting said peak power capability of said power amplifier circuitry.

16. The wireless communication device according to claim 15, wherein the determining circuitry is configured to use the calculated PAPR of said input signal to identify an entry in a lookup table that stores said at least one configuration parameter in association with a target PAPR.

17. The wireless communication device according to claim 15, wherein said lookup table is built by calibrating at least said at least one peak amplifier path in a production stage of said power amplifier circuitry.

18. The wireless communication device according to claim 15, wherein said wireless communication device is a wireless network node or a wireless terminal device.

19. A wireless communication device, comprising:
- one or more processors; and
- one or more memories including computer program code,
- the one or more memories and the computer program code configured to, with the one or more processors, cause said wireless communication device to:
- calculate a Peak to Average power Ratio, PAPR, of an input signal of said power amplifier circuitry, wherein said power amplifier circuitry comprises at least one amplifier path and at least one peak amplifier path and said power amplifier circuitry is configured to output a signal combining amplified signals from said at least one main amplifier path and said at least one peak amplifier path;
- determine at least one configuration parameter of said at least one peak amplifier path from a plurality of different configuration parameters depending upon the calculated PAPR of said input signal, the at least one configuration parameter operable to adjust the amplified signal from the at least one peak amplifier path; and
- configure said at least one peak amplifier path based on the determined at least one configuration parameter, thereby adjusting said peak power capability of said power amplifier circuitry.

* * * * *